United States Patent [19]

Briley et al.

[11] Patent Number: 4,535,360

[45] Date of Patent: Aug. 13, 1985

[54] LOW POWER WIDEBAND SWITCHING ARRAY ELEMENT

[75] Inventors: Bruce E. Briley, Countryside; Jeffrey A. Hiltner, Winfield, both of Ill.

[73] Assignee: AT&T Bell Laboratories, Murray Hill, N.J.

[21] Appl. No.: 536,947

[22] Filed: Sep. 27, 1983

[51] Int. Cl.³ .................. H04N 5/22; H04N 1/00; H04N 5/68; H04N 5/64
[52] U.S. Cl. ..................... 358/181; 358/86; 307/243; 307/254
[58] Field of Search ............ 307/360, 244, 254, 455, 307/243; 358/86, 181

[56] References Cited

U.S. PATENT DOCUMENTS

| | | | |
|---|---|---|---|
| 3,497,824 | 2/1970 | Goordman | 330/30 |
| 3,846,712 | 11/1974 | Kiko | 330/30 |
| 3,904,977 | 9/1975 | Barsotti | 330/51 |
| 4,048,626 | 9/1977 | Fett | 340/173 |
| 4,339,674 | 7/1982 | Hashimoto | 307/362 |
| 4,346,381 | 8/1982 | Bauch et al. | 340/825.93 |
| 4,349,750 | 9/1982 | Geurts | 307/243 |

OTHER PUBLICATIONS

*The Line Driver and Line Receiver Data Book for Design Engineers*, 1977, p. 28.

Primary Examiner—John C. Martin
Assistant Examiner—Howard L. Carter
Attorney, Agent, or Firm—John C. Moran

[57] ABSTRACT

A switching array comprising low power switching elements for switching high bandwidth pulse encoded signals with minimum distortion. Each switching element comprises an emitter-coupled pair of transistors which are used to switch the pulse encoded signals. The pair of transistors are enabled and disabled by inhibiting the flow of electrical current through the latter. A transistorized switch controls the electrical current in the pair of transistors in response to signals from a control register within the switching array. Since no current is flowing in the pair of transistors when the element is inhibited, the power dissipation approaches zero in the inhibit state resulting in an overall low power dissipation for the switching array since only a small number of elements are normally enabled at any time. Each element further comprises an emitter-follower transistor for the purpose of isolating the pair of transistors from the remainder of the switching array in order to reduce the crosstalk between pulse encoded signals.

6 Claims, 2 Drawing Figures

LOW POWER WIDEBAND SWITCHING ARRAY ELEMENT

TECHNICAL FIELD

This invention relates to high-speed wide band switching and more particularly to a switching array element capable of high-speed switching with low power dissipation.

BACKGROUND OF THE INVENTION

The term "wide band signals" is defined here to mean pulse encoded TV signals which depending on the coding scheme will range from 1.5 million bits per second (mbps) to 216 mbps. An essential component of a switching network designed to switch wide band signals is a switching element which can switch the digital signals at the required rate, is capable of being fabricated into large arrays, and has low power dissipation. With certain types of pulse encoding schemes, such as pulse width modulation, the integrity of each digital pulse must be maintained. Distortion of the digital pulse is often referred to as "jitter". Jitter results in the pulse width being altered and normally results from the switching element having varying turn-on and turn-off thresholds due to crosstalk between switching elements or design deficiencies of the switching element.

A commonly used technique for designing circuits for switching digital signals at high speeds is to use emitter coupled logic (ECL). One commercially available high-speed ECL switching device that is capable of switching digitized video is the HXA230-101 which is manufactured by the Signetics Corporation. This device consists of 128 switching elements and is capable of connecting 8 output terminals to either of 16 input terminals. Since this device uses conventional ECL circuits, it dissipates approximately 2.4 watts. The reason for such a high power dissipation is that in conventional ECL circuits, the switching element draws full power independent of whether the element is in the enabled state or disabled state. Power dissipation is thus a severe problem when trying to implement a large video switch using a device such as the Signetics device. For example, a switching network capable of connecting a hundred sources to any of a hundred destinations would have a power dissipation of approximately 300 watts even though only a maximum of a 100 switching elements would be in the enabled state at any one time. The high power dissipation makes the array less economical because of the cost of the power supplies and power distribution. In addition, it also limits the maximum size of the switching network since the arrays cannot be packaged in close proximity to one another.

In view of the foregoing, there exists a need for a switching element which has the capability of switching pulse video signals, has low power dissipation, and has minimal jitter. Furthermore, the switching element should be capable of being integrated in large numbers onto a single integrated circuit for use in large switching networks.

SUMMARY OF THE INVENTION

The foregoing problems are solved and a technical advance is achieved in accordance with the principles of this invention as incorporated in a structured embodiment of a switching array element which achieves low power dissipation by entering a power down state when disabled from switching video signals. Jitter is reduced by utilizing an isolation unit which isolates the switching element from the remainder of the array and by reducing the linear operating region of the transistors which switch the video signals through the switching element. A switching array comprising a large number of these switching elements can be constructed on a single integrated circuit because power dissipation is reduced since only the elements actually switching video signals are dissipating power, because crosstalk between elements is reduced by each element's isolation unit, and because the compact structure of the elements allows a large number of the latter to be fabricated on one integrated circuit.

An emitter-coupled pair of transistors are utilized to switch the video signals, and the pair of transistors are enabled and disabled by inhibiting the flow of electrical current through the latter. A transistorized switch controls the electrical current in the emitter-coupled pair of transistors in response to signals from a control register within the switching array. Since no current is flowing in the emitter-coupled pair of transistors when the element is inhibited, the power dissipation approaches zero in the inhibit state. Jitter is reduced by designing the element such that the emitter-coupled pair of transistors have only a small linear region resulting in the emitter-coupled pair precisely tracking the video signals with a minimum amount of inaccuracy.

A transistorized isolation switch comprising an emitter-follower transistor is used to isolate the emitter-coupled pair of transistors from the remainder of the switching array. Advantageously, the emitter-follower transistor exhibits low capacitive coupling between the emitter-coupled pair of transistors and the remainder of the switching array. This low capacitive coupling reduces the crosstalk between elements which further reduces the amount of jitter introduced into the video signals during transmission through each element. In addition, the emitter-follower transistor has excellent drive characteristics for transmitting the video signals from each switching element to the remainder of the switching array.

The switching element comprises an emitter-coupled pair of transistors for communication of video signals from the collector of one of the emitter-coupled pair to the base of an emitter-follower transistor which in turn communicates the video signals to an output link interconnecting the switching element to the remainder of the switching array. The emitters of the emitter-coupled pair of transistors are connected to the collector of a transistorized current source whose emitter in turn is connected to a resistor. Whether or not electrical current flows in the emitter-coupled pair of transistors, the current source and resistor is determined by a transistorized switch connected to the other side of the resistor. The transistorized switch is controlled by a signal from a control register within the switching array. If the transistorized switch inhibits the flow of current, then the switching element is disabled from switching video signals and placed in approximately a zero-power dissipation state. If the transistorized switch allows current to flow, the switching element communicates the video signals to the output link.

DETAILED DESCRIPTION

Figure 1:
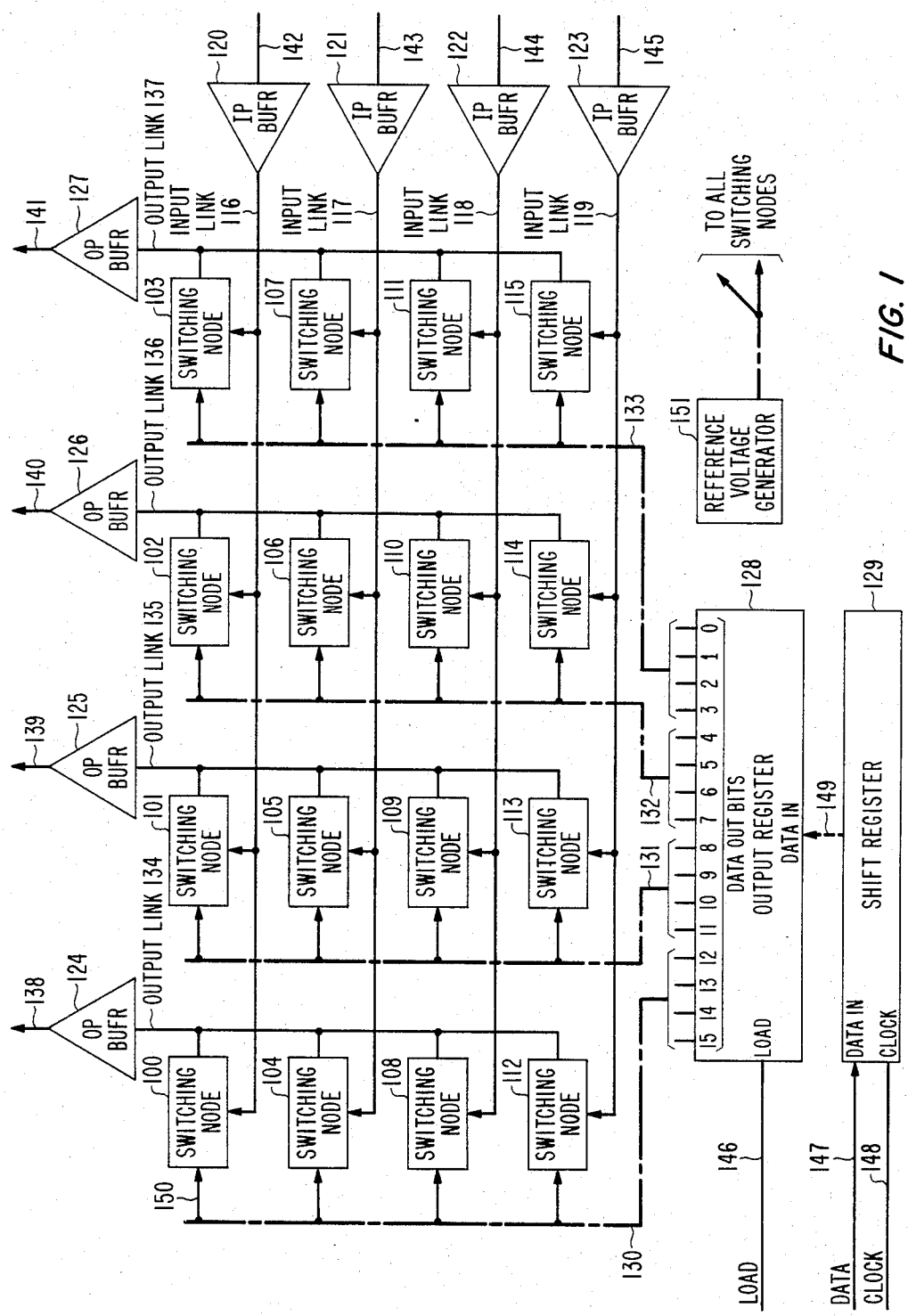
FIG. 1 illustrates, in block diagram form, a switching array utilizing the switching element of the present invention.

FIG. 1 shows an illustrative switching array having a plurality of switching elements/nodes 100–115 for communicating digitally encoded video signals from input conductors 142–145 to output conductors 138–141. Such a switching array is designed for use in a nonblocking network which communicates digitally encoded video signals. An example of nonblocking network is disclosed in the article by C. Clos, "A Study of Nonblocking Switching Networks," *The Bell System Technical Journal,* March 1953, pgs. 406–424. In such a switching network, the switching array of FIG. 1 communicates video signals from an input conductor to an output conductor via an input buffer, an input link, a switching node, and an output buffer. For example, a video signal being transmitted on conductor 145 is communicated to output conductor 138 in the following manner. Input buffer 123 is responsive to the video signal on conductor 145 to transfer this signal to input link 119. Switching node 112 is responsive to an enable signal from output register 128 received via cable 130 to transfer the video signal from input link 119 to output link 134. In response to the video signal on output link 134, output buffer 124 transmits this video signal on conductor 138.

The contents of output register 128 control the communication video signals from the input conductors 142–145 to the output conductors 138–141 by enabling and disabling switching nodes 100–115. At initialization and as required during network operation, a central processor controls the contents of output register 128 by first transferring the control data into shift register 129 via conductors 147 and 148 in a well-known serial manner, and then by transferring the contents of shift register 129 to output register 128 by transmitting a load signal via conductor 146 to output register 128. In response to the load signal, output register 128 stores the information from shift register 129 which is transmitted via cable 149. Each data out bit of output register 128 is transferred to a particular switching node via cables 130, 131, 132 or 133. For example, data out bit 15 is transferred only to node 100 by conductor 150 in cable 130.

A switching node is responsive to the received data bit being a "1" to connect the input link to the output link and responsive to the data bit being a "0" to enter a low power state. In the lower power state, power is reduced, and a high-impedance, low crosstalk state is inserted between the input and the output links. Output buffers 124 through 127 and input buffers 120 through 123 represent well known buffering circuits and are used to interface the nodes to the remainder of switching network.

Reference voltage generator 151 generates the necessary internal voltages required by the switching nodes and output and input buffer circuits.

Figure 2:
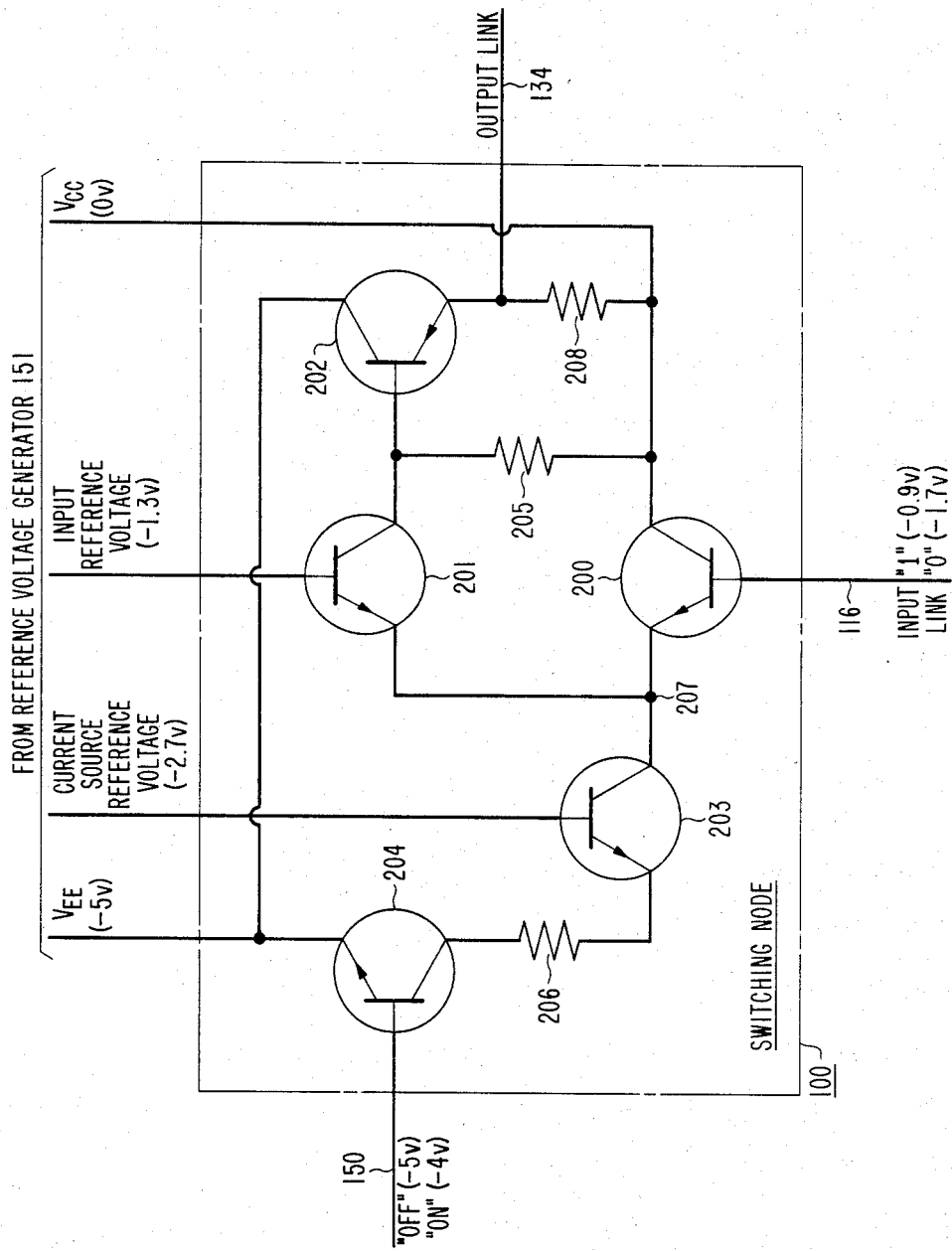
FIG. 2 illustrates switching element 100 of the switching array illustrated in FIG. 1, which is the subject of the present invention.

FIG. 2 illustrates switching node 100 of FIG. 1 with examples of illustrative operating voltages shown in parentheses. The basic switching function is performed by transistors 200 and 201, and the disabling and powering down of switching node 100 is performed by transistor 204. Transistor 203 determines the amount of current which can flow in both transistors 200 and 201. Transistor 202 is the output stage of the switching node and greatly reduces the crosstalk resulting from capacitive coupling between the output link 134 and input link 116 versus that which would be present if the output link 134 were connected directly to the collector of transistor 201.

Switching node 100 is enabled by a signal being received on conductor 150 having voltage which is illustratively equal to −4 volts. This voltage is received on conductor 150 when data out bit 15 of output register 128 is a "1". When this voltage is being received on the base of transistor 204, the latter saturates allowing current to flow through transistor 203 and transistors 200 and 201. The amount of current which flows is determined by transistor 203 and resistor 206. Since current can now flow through transistors 200 and 201, the node is enabled and is responsive to the voltage received on input link 116. If a voltage greater than the input reference voltage, which is illustratively equal to −1.3 volts, is received on input link 116, transistor 200 conducts causing transistor 201 to be turned off since transistor 200 being on forces point 207 to illustratively be at a potential of greater than −2 volts. Since the base of transistor 201 is at the input reference voltage, transistor 201 cannot turn on. The reason is that the base to emitter voltage of transistor 201 cannot be greater than illustratively 0.7 volts, as required to turn transistor 201 on when point 207 is illustratively at a potential greater than −2.0 volts. Similarly, if the voltage received on input link 116 is less than the input reference voltage, then transistor 200 is in the off condition and transistor 201 conducts current. During the transition between transistor 200 conducting current and transistor 201 being off and vice versa, there is an operating point where both transistors are conducting, and the transistors are operating in a linear region. An important aspect of the node design is that this linear region is limited to when the voltage on input link 116 is plus or minus a few millivolts of the input reference voltage at the base of transistor 201. Limiting this linear region, greatly reduces "jitter" through the node.

When transistor 201 is conducting current, this lowers the voltage on the base of transistor 202 turning it on, resulting in the voltage output link 134 being illustratively equal to −1 volt. Note, that when transistor 201 is turned off, the base of transistor 202 is approximately equal to Vcc hence transistor 202 is in the off condition, and the voltage on output link 134 is driven illustratively to 0 volts by resistor 208.

It is to be understood that the above-described embodiment is merely illustrative of the principles of the invention and that other arrangements may be devised by those skilled in the art without departing from the spirit and scope of the invention. In particular, one skilled in the art could readily devise a structure whereby the output of each switching node is terminated on an individual input of an OR gate within an output buffer rather than the output being connected to a shared output link. Such a structure could also eliminate the emitter-follower transistor from each switching node allowing the emitter-coupled pair of transistors to be connected directly to the OR gate within the output buffer.

What is claimed is:

1. A switching device comprising a pair of transistors each having a base, an emitter, and a collector, and configured as an emitter-coupled pair for the communication of video signals from said base of one of said pair of transistors to said collector of another one of said pair of transistors, a transistor current source having an emitter and a collector and having its collector connected to said emitters of said pair of transistors, a resistor connected with said emitter of said current source, a transistor switch serially connected to said resistor and said emitter of said current source and responsive to a receipt of an enable signal to allow current to flow through said resistor for enabling said pair of transistors to communicate said video signals and further responsive to a receipt of a disable signal for inhibiting the flow of current through said resistor thereby inhibiting the communication of said video signals and dissipation of power by said pair of transistors.

2. The switching device of claim 1 further comprises a transistor isolation unit having a base and an emitter, having its base connected to said collector of said other one of said pair of transistors, an output link for communicating said video signals from said switching device and connected to said emitter of said transistor isolation unit, and said transistor isolation unit responsive to a receipt of said video signals on said collector of said other one of said pair of transistors for communicating said video signals to said output link.

3. A switching array having a plurality of input links and plurality of output links and a plurality of input buffers each responsive to a receipt of video signals for transmitting said video signals on an individual one of said input links;

a plurality of sets of switching nodes each of said sets being responsive to a receipt of said video signals transmitted via a particular one of said input links to communicate the transmitted signals to a particular one of said output link;

a plurality of output buffers each responsive to a receipt of the communicated signals on an individual one of said output links for retransmitting said communicated signals;

each of said nodes comprising a pair of transistors each having a base, an emitter, and a collector, and configured as an emitter-coupled pair for the communication of said transmitted signals from said base of one of said pair of transistors to said collector of another one of said pair of transistors, a transistor current source having an emitter and a collector and having its collector connected to said emitters of said pair of transistors, a resistor connected to said emitter of said current source, a transistor switch connected to said resistor for controlling the flow of electricity in said resistor and said pair of transistors;

control storage means for storing individual control signals for each of said nodes to communicate said video signals to said output buffers in a manner so as to reduce the power consumption of said switching array;

said transistor switch responsive to a receipt of an enabling one of said control signals to allow current to flow through said resistor for enabling said pair of transistors to communicate said transmitted signals and further responsive to a receipt of a disabling one of said control signals for inhibiting the flow of current through said resistor thereby inhibiting the dissipation of power and the communication of said transmitted signals.

4. The switching device of claim 3 further comprises a transistor isolation unit having a base and a collector and having its base connected to said collector of said other one of said pair of transistors and responsive to a receipt of said transmitted signals on said collector of said other one of said pair of transistors for communicating said transmitted signals to said output link via said emitter of said transistor isolation unit.

5. A low-power, wide band switching array for communication of video signals having a plurality of pairs of transistors each pair configured as an emitter-coupled pair of transistors in which power is reduced by supplying electrical current only to ones of said pairs of transistors which are actively communicating said video signals and each transistor of said pairs of transistors having a base, an emitter, and a collector, said switching array further comprising a plurality of current sources each being individually serially connected to the emitters of individual ones of said pairs of transistors; and a plurality of transistor switches each serially connected to individual ones of said current sources and each one of said transistor switches being responsive to a receipt of an enable signal to allow current to flow through the connected one of said current sources for enabling the one of said pairs of transistors connected to said connected one of said current sources to communicate said video signals from said base of said one of said pairs of transistors connected to said connected one of said current sources to said collector of said other one of said pairs of transistors connected to said connected one of said current sources, and further responsive to a receipt of a disable signal for inhibiting the flow of current through said connected one of said current sources thereby inhibiting the communication of said video signals and dissipation of power by said one of said pairs of transistors connected to said connected one of said current sources.

6. The switching array of claim 5 further comprises a transistor isolation unit having a base and an emitter, and having its base connected to said collector of said other one of said pairs of transistors connected to said connected one of said current sources, an output link for communicating said video signals from said one of said pairs of transistors connected to said connected one of said current sources and connected to said emitter of said transistor isolation unit, and said transistor isolation unit responsive to a receipt of said video signals on said collector of said other one of said pairs of transistors connected to said connected one of said current sources for communicating said video signals to said output link.

* * * * *